United States Patent
Kim et al.

(10) Patent No.: US 6,632,717 B2
(45) Date of Patent: Oct. 14, 2003

(54) TRANSISTOR OF SEMICONDUCTOR DEVICE AND METHOD OF MANUFACTURING THE SAME

(75) Inventors: Kil Ho Kim, Kyoungki-do (KR); Jong Il Kim, Daejeon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/141,171

(22) Filed: May 9, 2002

(65) Prior Publication Data

US 2003/0001205 A1 Jan. 2, 2003

(30) Foreign Application Priority Data

Jun. 28, 2001  (KR) ........................................ 2001-37463

(51) Int. Cl.$^7$ .............................................. H01L 21/334
(52) U.S. Cl. ...................... 438/291; 438/301; 438/264
(58) Field of Search ................................ 438/291, 181, 438/182, 301, 264, 593, 257

(56) References Cited

U.S. PATENT DOCUMENTS

| | | | | |
|---|---|---|---|---|
| 6,207,007 B1 | * | 3/2001 | Segawa et al. | 156/345.26 |
| 6,309,933 B1 | * | 10/2001 | Li et al. | 438/291 |
| 6,426,529 B2 | * | 7/2002 | Kobayashi | 438/264 |
| 6,429,072 B1 | * | 8/2002 | Tsukiji | 438/257 |

* cited by examiner

Primary Examiner—John F. Niebling
Assistant Examiner—Walter L. Lindsay, Jr.
(74) Attorney, Agent, or Firm—Finnegan, Henderson, Farabow, Garrett & Dunner, L.L.P.

(57) ABSTRACT

The present invention relates to a transistor of a semiconductor and a method of fabricating the same. In the method, the dual gate electrode may have different widths and is formed using a damascene process. The dual gate electrode is formed using a stacked upper having a first gate electrode and a second gate electrode. The second gate electrode may have a broader width than the lower first gate electrode.

4 Claims, 7 Drawing Sheets

TRANSISTOR OF SEMICONDUCTOR DEVICE AND METHOD OF MANUFACTURING THE SAME

BACKGROUND OF THE INVENTION

1. Field of the Invention

The present invention generally relates to a semiconductor device and a method of manufacturing the same. In particular, the present invention relates to a dual gate electrode having a stacked structure comprising a first gate electrode and a second gate electrode larger than the first gate electrode.

2. Description of the Background Art

Conventional semiconductor devices have problems, such as RC delay, short channel effects, and increased contact resistance as junction depth is decreased.

As a result, a salicide structure, an elevated source/drain ("ESD"), or both are employed to form a source/drain region on a semiconductor substrate, such as by a selective epitaxial process.

FIGS. 1a through 1d illustrate a conventional method of fabricating a transistor. A gate oxide 13 and a gate electrode 15 are formed on a p-type semiconductor substrate 11 (see FIG. 1a). A lightly doped drain region (hereinafter referred to as the 'LDD' region) 17 is then formed by ion-implanting low concentration, low energy n-type impurities and using a mask on the surface of the semiconductor substrate 11 at both sides of the gate electrode 15 (see FIG. 1b). Next, an oxide film is formed on the entire surface including the gate electrode 15. The oxide film is etched to form an oxide spacer 19 on side walls of the gate electrode 15 (see FIG. 1c). A source/drain region 21 is formed on the exposed region of the semiconductor substrate 11 by ion-implanting high concentration, high energy n-type impurities using the oxide spacer 19 and the gate electrode 15 as masks (see FIG. 1d).

However, the conventional method of fabricating a transistor has several problems. The width of a gate electrode is limited by the thickness of the polysilicon layer, which is used to form the gate electrode, and the etching selectivity of the photoresist layer used as a mask for etching the polysilicon layer.

It is difficult to decrease the width of the photoresist layer. The thickness of the photoresist layer must often be maintained at a certain level. In addition, a limit in the channel length can also prevent high integration.

In addition, when the width of the gate electrode is reduced, the surface resistance of the gate electrode increases and, thus, deteriorates the performance characteristics of the device. Furthermore, when a contact hole is formed at the upper side of the gate electrode, the process margin of the contact hole decreases and, thereby, potentially allowing a short circuit between the gate electrode and the active region, and resulting in decreased yield and reliability of the device.

SUMMARY OF THE INVENTION

In accordance with the present invention, a transistor of a semiconductor device comprises: a gate insulating film formed on a semiconductor substrate; a first gate electrode formed on the gate insulating film; a lightly doped drain (LDD) region formed on the semiconductor substrate at both sides of the first gate electrode; an oxide pattern of a predetermined width formed at a side wall of the first gate electrode; a second gate electrode formed at an upper portion of the first gate electrode and the oxide pattern; and a source/drain region formed on the semiconductor substrate at both sides of the second gate electrode.

In accordance with another aspect of the present invention, a method of fabricating a transistor of a semiconductor device comprises: sequentially forming a gate insulating film on a semiconductor substrate and a first gate electrode on the gate insulating film; forming a lightly doped drain (LDD) region on the semiconductor substrate at both sides of the first gate electrode; forming an insulating film; forming a groove exposing an upper portion of the first gate electrode by removing a portion of the insulating film at an upper portion of the first gate electrode, wherein a width of the removed portion of the insulating film is larger than that of the first gate electrode; forming a second gate electrode contacting the first gate electrode by filling the groove; forming an insulating film pattern at both sides of the first gate electrode by removing the insulating film at both sides of the second gate electrode and to expose the semiconductor substrate; and forming a source/drain region on the semiconductor substrate at both sides of the second gate electrode.

Additional features of the invention will be set forth in part in the description which follows, and in part will be obvious from the description, or may be learned by practice of the invention. The features of the invention will be realized and attained by means of the elements and combinations particularly pointed out in the appended claims.

BRIEF DESCRIPTION OF THE DRAWINGS

The present will be become better understood with reference to the accompanying drawings, which are given only by way of illustration and thus are not limitative of the present invention, wherein.

DETAILED DESCRIPTION OF THE PREFERRED EMBODIMENTS

A transistor of a semiconductor device and a method of fabricating the same in accordance with the present invention will now be described in detail with reference to the accompanying drawings.

Figure 1A:
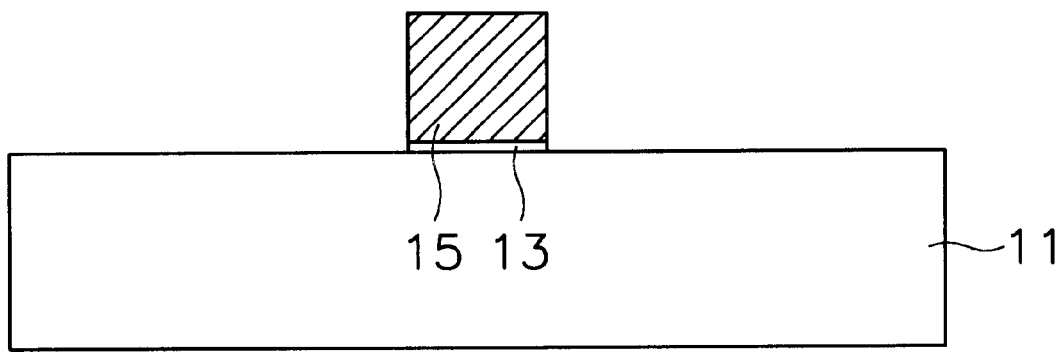
FIGS. 1a through 1d illustrate conventional methods of fabricating a transistor of a semiconductor device.
Figure 1B:
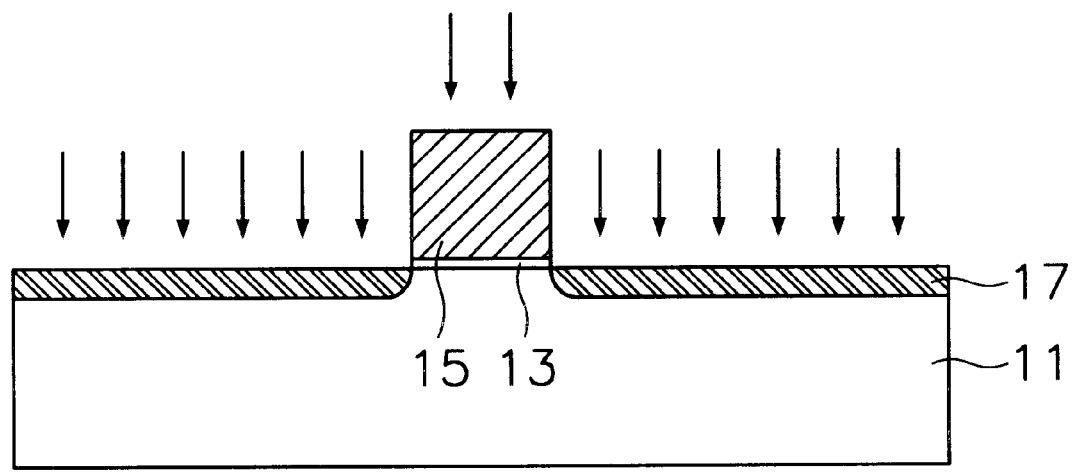
Figure 1C:
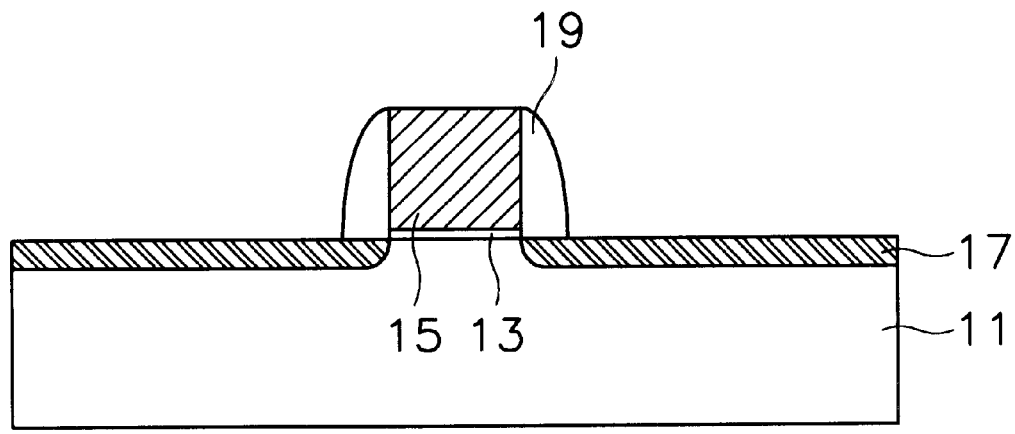
Figure 1D:
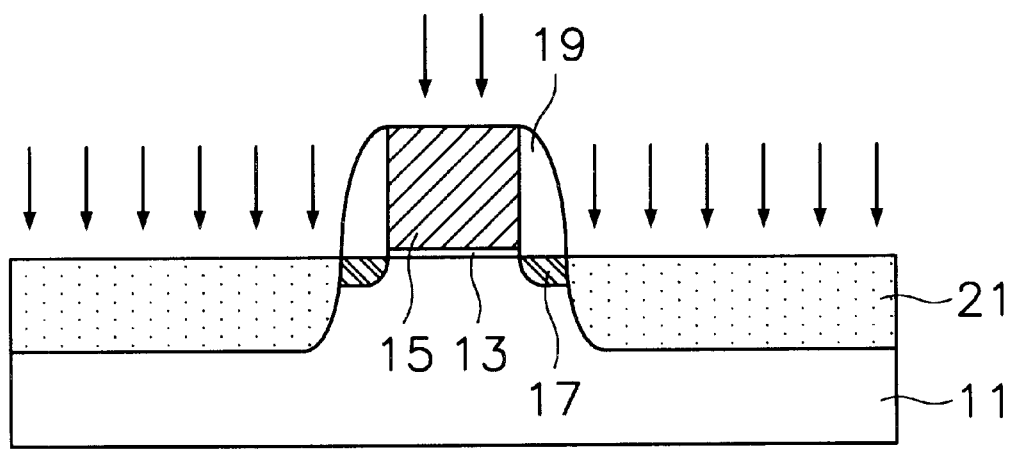
Figure 2:
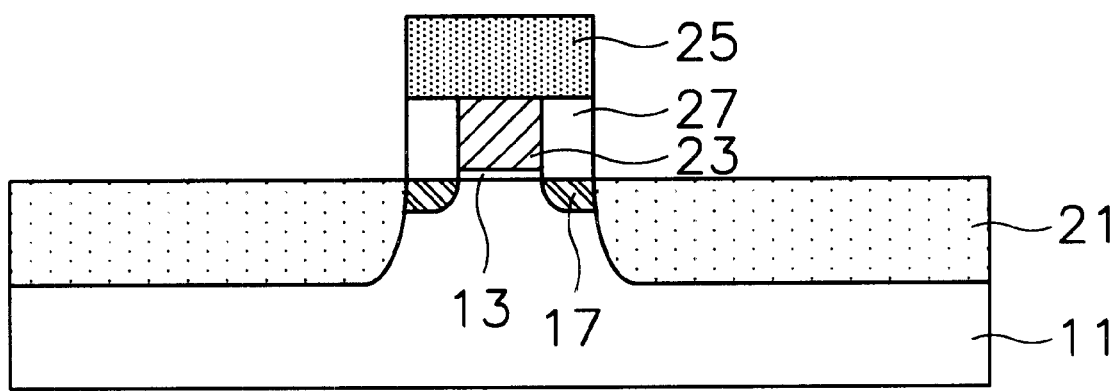
FIG. 2 is a cross-sectional diagram illustrating a transistor consistent with the principles of the present invention.

FIG. 2 is a cross-sectional diagram illustrating a transistor of a semiconductor device consistent with the principles of the present invention.

A gate oxide 13 is formed on a p-type semiconductor substrate 11 and a dual gate electrode formed on the gate oxide 13. The dual gate electrode may have different widths.

The dual gate electrode may have a stacked structure comprising a first gate electrode 23 and a second gate electrode 25. The first gate electrode 23 may have a predetermined width formed on the gate oxide 13. The second gate electrode 25 may have a width broader than the first gate electrode 23.

An oxide film 27 is formed at a side wall of the first gate electrode 23, which may also be an undercut portion of the second gate electrode 25. LDD region 17 is formed by ion-implanting, low concentration low energy n-type impurities on the semiconductor substrate 11 at both sides of the first gate electrode 23. A source/drain region 21 is formed using high concentration ion-implanting and high energy n-type impurities on the semiconductor substrate 11 at both sides of the second gate substrate 25.

A channel width is determined by the first gate electrode 23. A process margin of a contact in the gate electrode is determined by the second gate electrode 25.

Figure 3A:
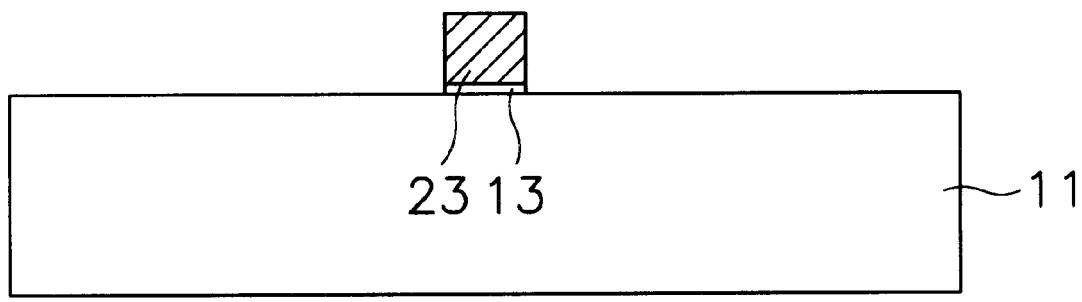
FIGS. 3a through 3g are diagrams illustrating methods of fabricating a transistor consistent with the principles of the present invention.

FIGS. 3a through 3g are diagrams illustrating methods of fabricating a transistor consistent with the principles of the present invention. Referring to FIG. 3a, a gate oxide 13, a polysilicon layer, and a photoresist film are sequentially formed on a p-type semiconductor substrate 11.

A photoresist film pattern may be formed by selectively exposing and developing the photoresist film using a mask for the first gate electrode. The first gate electrode 23 is formed by etching the polysilicon layer using the photosensitive film pattern as a mask. The photosensitive film pattern may then be removed.

In one embodiment, the polysilicon layer is formed thinner than for a conventional gate electrode but thicker than the depth of an LDD region formed in a subsequent process. Since the polysilicon layer is thinner, the photosensitive film may be thinly coated and, thus, allow the minimum patternable width to be decreased to less than a conventional photosensitive film pattern for etching a polysilicon layer for a gate electrode.

In addition, since the polysilicon layer is thinner, etching may be more even during the process of forming the first gate electrode. Further, since the polysilicon layer is not overetched, it is possible to prevent damage to gate oxide 13 and the upper part of the semiconductor substrate 11.

Figure 3B:
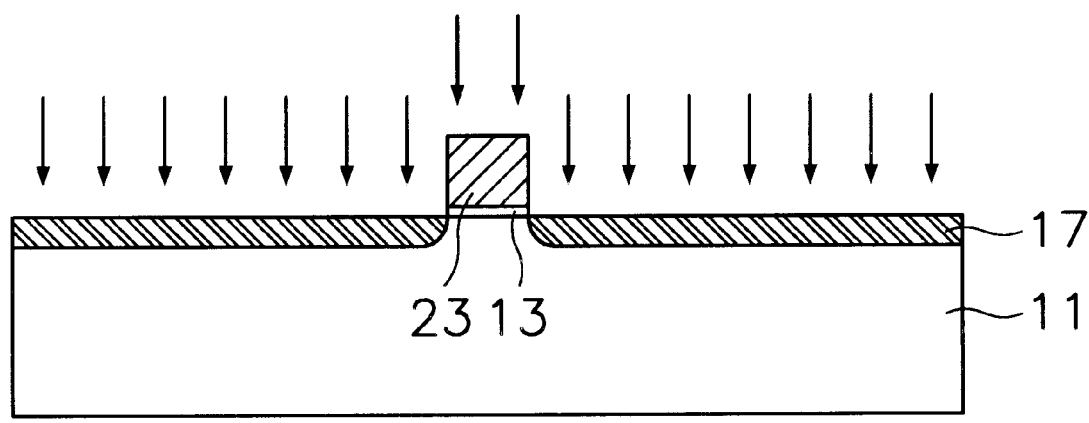
Figure 3C:
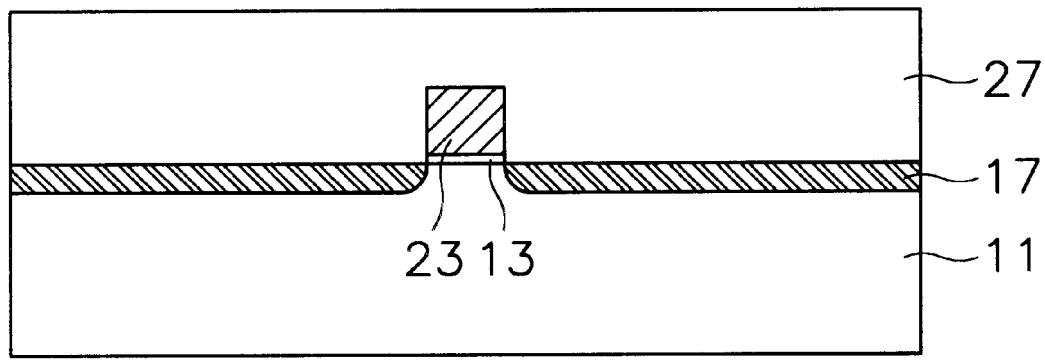
Figure 3D:
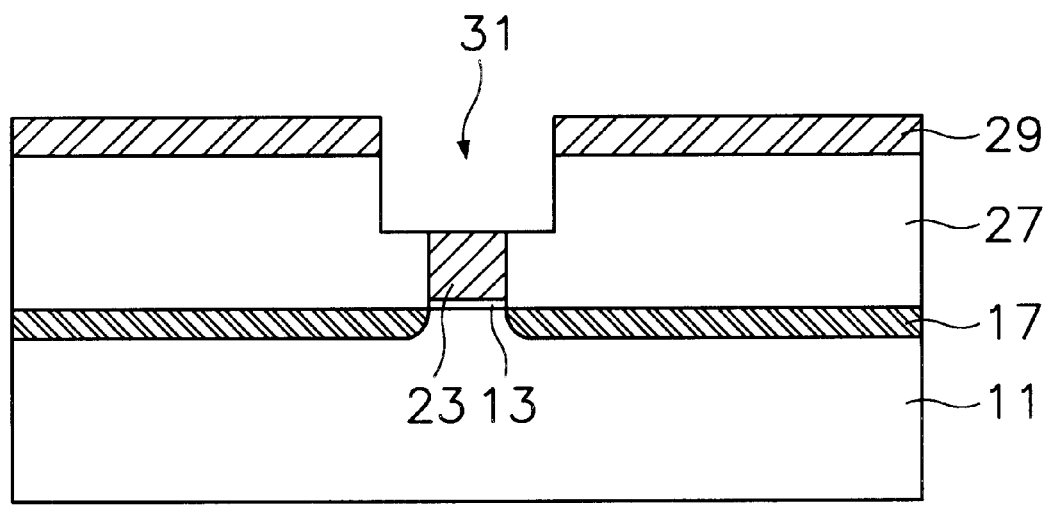

Referring to FIG. 3b, LDD region 17 is formed at the surface of the semiconductor substrate 11 at both sides of the first gate electrode by ion-implanting, low concentration low energy n-type impurities using the first gate electrode 23 as a mask.

Referring to 3c, an oxide film 27 is formed on the whole surface of the resultant structure and planarized by a chemical mechanical polishing ("CMP") process. In one embodiment, the planarized oxide film 27 is thicker than a conventional gate electrode.

Referring to 3d, a photoresist film 29 is formed on the planarized oxide film 27, and selectively exposed and developed to form a photosensitive film pattern 29. The photosensitive film pattern 29 may have an opening that is wider than the first gate electrode.

A groove 31 is formed by etching the oxide film 27 which is exposed through the opening to expose the first gate electrode 23. In one embodiment, the width of the groove 31 is larger than a conventional gate electrode, but smaller than the conventional gate electrode and the insulating film spacer together. The width of groove 31 may be based on a design rule.

Figure 3E:
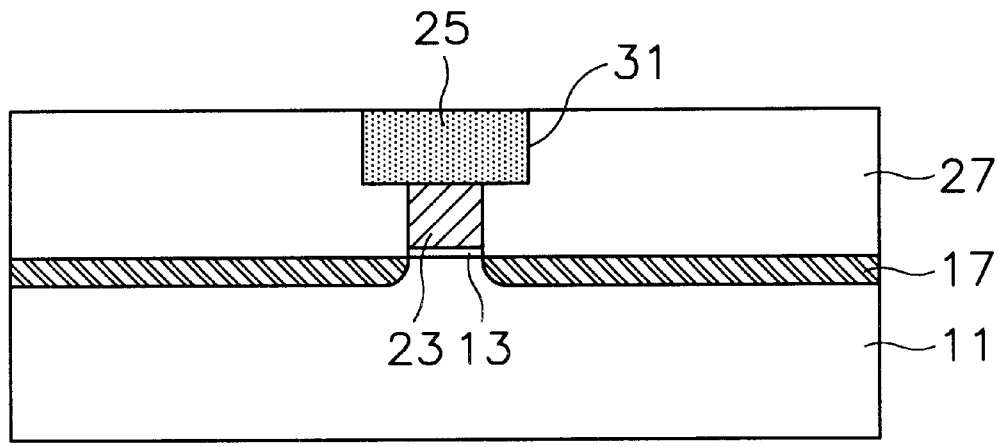
Figure 3F:
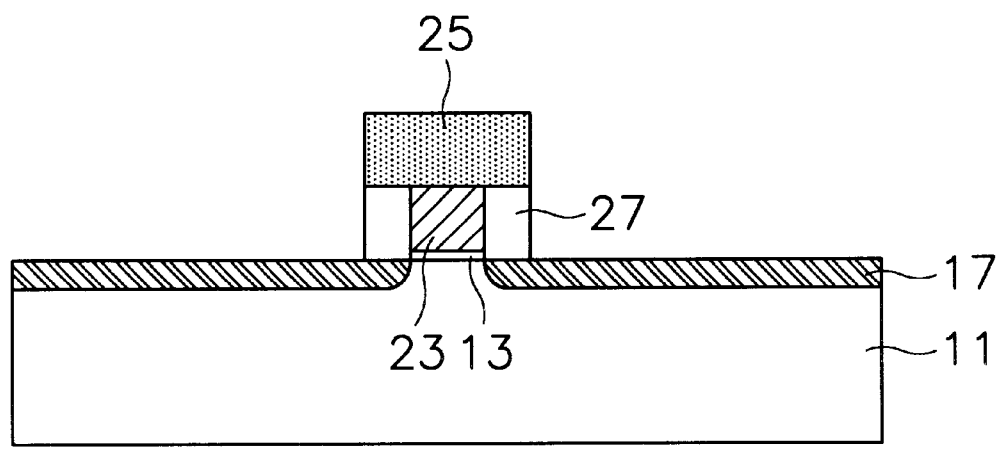
Figure 3G:
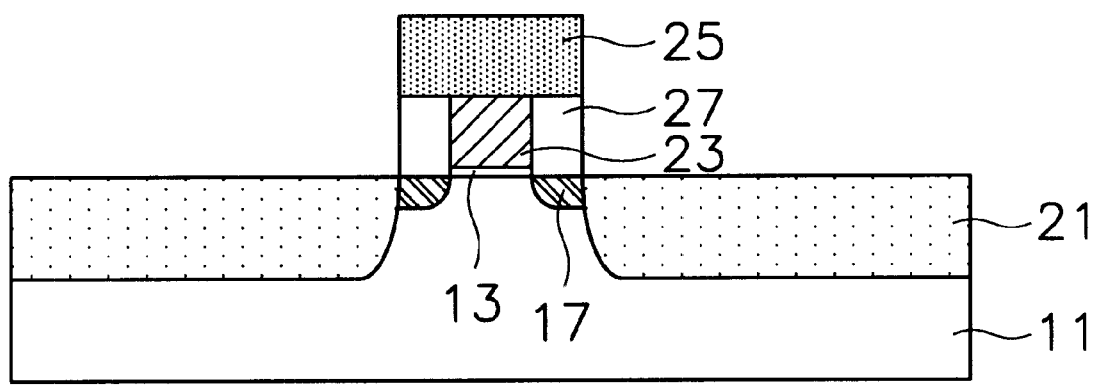

Referring to FIG. 3e, a second gate electrode 25 is formed by removing the photosensitive film 29 pattern, and coating a polysilicon layer on the whole surface of the structure to fill up the groove 31. The polysilicon layer may be etched using a CMP process, using the oxide film 27 as an etch stop layer to have the polysilicon layer remain in groove 31.

Referring to 3f, the semiconductor substrate 11 is exposed by employing a plasma containing activated $C_xF_y$ gas to etch the oxide film 27 using the second gate electrode 25 as a mask. The oxide film 27 may be substituted with an insulator having a different etching selectivity from the second gate electrode 25.

Referring to 3g, a source/drain region 21 is formed at the surface of the semiconductor substrate 11 at both sides of the second gate electrode 25 by ion-implanting a high concentration, high energy n-type impurities using the second gate electrode 25 as a mask.

The first and second gate electrodes may be formed of different materials such a silicide, a salicide, other than a polysilicon layer. The dual gate electrode may be formed with different widths using a damascene process. When the dual gate electrode is formed having a stacked structure comprising a lower first gate electrode and an upper second gate electrode having a broader width than the first gate electrode, the channel length may be decreased due to the first gate electrode having a smaller width. In addition, integration may be improved, and the surface resistance of the gate electrode may be decreased due to the second gate electrode having a larger width. In addition, other characteristics of the device, such as operational speed and process margin of the contact hole in the upper part of the gate electrode may be improved. Furthermore, short circuits between the gate electrode and the active region may be prevented. Thus, the yield and reliability of the device may be improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of fabricating a transistor of a semiconductor device, the method comprising:

sequentially forming a gate insulating film on a semiconductor substrate and a first gate electrode on the gate insulating film;

forming a lightly doped drain (LDD) region on the semiconductor substrate at both sides of the first gate electrode;

forming an insulating film;

forming a groove exposing an upper portion of the first gate electrode by removing a portion of the insulating film at an upper portion of the first gate electrode, wherein a width of the removed portion of the insulating film is larger than that of the first gate electrode;

forming a second gate electrode contacting the first gate electrode by filling the groove;

forming an insulating film pattern at both sides of the first gate electrode by removing the insulating film at both sides of the second gate electrode and to expose the semiconductor substrate; and forming a source/drain region on the semiconductor substrate at both sides of the second gate electrode.

2. The method according to claim 1, wherein the first gate electrode is formed thicker than a depth of the LDD region.

3. The method according to claim 1, wherein the insulating film is formed of an oxide film.

4. The method according to claim 3, wherein the oxide film is etched by using a plasma containing $C_xF_y$ gas.

* * * * *